United States Patent
De Cuyper et al.

(10) Patent No.: US 7,482,827 B2
(45) Date of Patent: Jan. 27, 2009

(54) INTEGRATED CIRCUIT WITH TESTABLE CLOCK CIRCUITS

(75) Inventors: Steven H De Cuyper, Braschaat (BE); Graeme Francis, Southampton (GB)

(73) Assignee: NXP B.V., Eindhoven (NL)

( * ) Notice: Subject to any disclaimer, the term of this patent is extended or adjusted under 35 U.S.C. 154(b) by 82 days.

(21) Appl. No.: 11/719,091

(22) PCT Filed: Oct. 28, 2005

(86) PCT No.: PCT/IB2005/053527

§ 371 (c)(1),
(2), (4) Date: May 10, 2007

(87) PCT Pub. No.: WO2006/051438

PCT Pub. Date: May 18, 2006

(65) Prior Publication Data

US 2008/0204063 A1    Aug. 28, 2008

(30) Foreign Application Priority Data

Nov. 10, 2004   (GB)   ................................ 0424766.4

(51) Int. Cl.
*G01R 31/02* (2006.01)
(52) U.S. Cl. .................. 324/763; 324/76.62; 377/19
(58) Field of Classification Search ......... 324/763–765, 324/76.39, 76.62; 377/19
See application file for complete search history.

(56) References Cited

U.S. PATENT DOCUMENTS

| | | | | |
|---|---|---|---|---|
| 5,475,324 A | * | 12/1995 | Tomiyori | 327/145 |
| 5,619,463 A | * | 4/1997 | Malhi | 365/201 |
| 6,101,196 A | * | 8/2000 | Murakami | 370/516 |
| 6,131,173 A | | 10/2000 | Meirlevede et al. | |
| 7,065,684 B1 | * | 6/2006 | Chan | 714/700 |

* cited by examiner

*Primary Examiner*—Ha Tran T Nguyen
*Assistant Examiner*—Richard Isla Rodas

(57) ABSTRACT

An integrated circuit (1) that comprises an internal clock circuit (12) with a clock output for clocking functional circuits (10) of the integrated circuit (1). The integrated circuit is provided with a counter circuit (16) and a state holding circuit (18) for use during testing. The integrated circuit is switched to a test mode and a start of a test time interval is signalled. Clock pulses from the internal clock circuit 12 are counted from the start of the test time interval and the state holding circuit (18) is locked into a predetermined state if the internal clock circuit has produced more than a predetermined number of clock pulses from the start of the test time interval. Information about whether the state holding circuit (18) has reached the predetermined state in the test time interval is read from the integrated circuit (1) and the information is used by a test evaluation apparatus (2) to accept or reject the integrated circuit (1).

5 Claims, 2 Drawing Sheets

INTEGRATED CIRCUIT WITH TESTABLE CLOCK CIRCUITS

Figure 1:
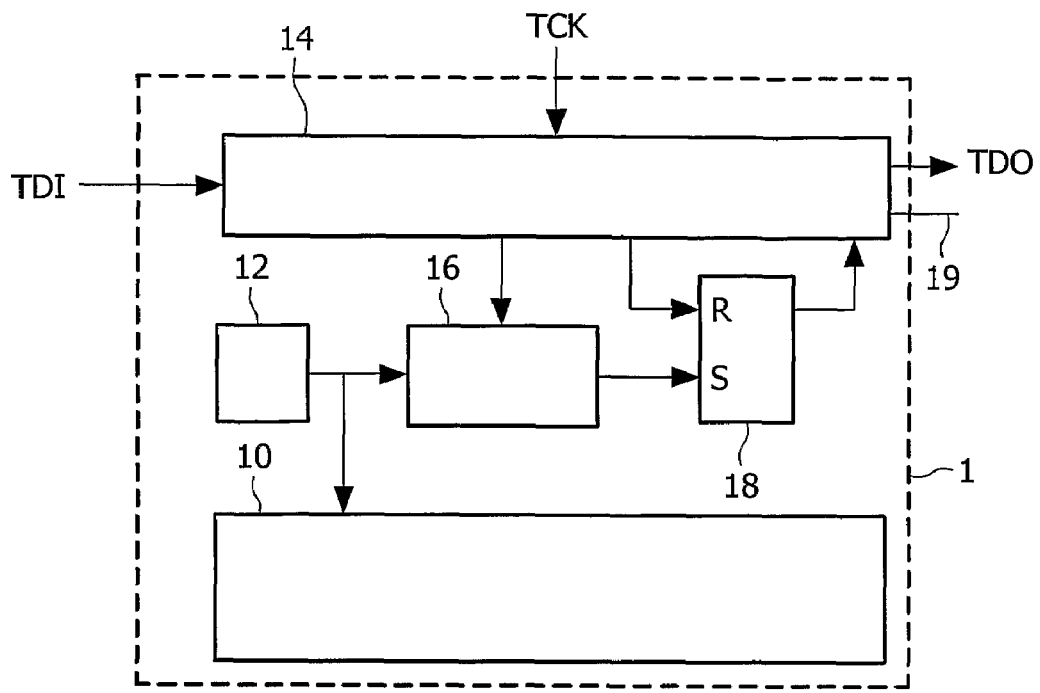

The invention relates to a testable integrated circuit with a testable internal clock circuit.

As described in U.S. Pat. No. 6,131,173 an integrated circuit may contain a plurality of clock domains. Such an integrated circuit is usually provided with a plurality of internal clock circuits that are used to clock different parts of the functional circuits within the integrated circuit. Many of these clock circuits contain frequency dividers, for example for generating a clock signal that is divided down from a higher frequency reference signal, or for providing a divided-down version of the clock signal to lock onto a reference signal. Testing of such clock circuits conventionally involves making time and frequency measurements of the clock signals. This may be done by switching the integrated into a test mode, wherein the clock signals from the internal clock circuits are coupled to external pins of the integrated circuit. A test apparatus connected to those pins is then used to measure the properties of the clock signals.

However, it is difficult to route high frequency clock signals out of integrated circuits. At least this requires considerable circuit overhead, both in terms of circuitry inside the integrated circuit and in the test environment. Since the number of internal clock signals tends to increase in modern integrated circuits, this overhead also increases.

As an alternative, it has been known to include clock signal measuring circuits for test purposes inside integrated circuits. Typically, this involves the use of an internal counter circuit that receives an internal clock signal and an external enabling signal to start and stop counting at externally defined time points. The resulting count is subsequently read from the counter and it is determined whether it is within an acceptable range. In this approach the need for external timing signals complicates the test, because specialized test equipment is needed for this purpose. Also the need to read out the count and/or to compare the count with boundary values for the acceptable range causes overhead in terms of test equipment and/or test time.

Among others, it is an object of the invention to provide for an integrated circuit that supports a test wherein operative aspects of an internal clock circuit can be tested with a minimum of overhead in terms of test time and special test equipment.

Among others, it is an object of the invention to provide for a method of testing operative aspects of an internal clock circuit of an integrated circuit with a minimum of overhead in terms of test time and special test equipment.

Among others, it is an object of the invention to provide for an integrated circuit that supports a test wherein operative aspects of a plurality of internal clock circuits can be tested by means of shared test circuitry with a minimum of overhead in terms of test time and special test equipment.

Among others, it is an object of the invention to provide for a method of testing operative aspects of a plurality of internal clock circuits of an integrated circuit by means of shared test circuitry with a minimum of overhead in terms of test time and special test equipment.

An integrated circuit according to the invention is set forth in claim 1. According to the invention an integrated circuit is provided with a test circuit that comprises a state holding circuit that is locked into a predetermined state when a count of clock pulses from an internal clock circuit reaches a threshold value. The circuit is arranged so that the clock pulses cannot cause a reverse transition from that state. During testing the test information is read out of the integrated circuit about whether the state holding circuit has reached the predetermined state within a test time interval. This test information does not provide an accurate frequency measurement: the circuit merely ensures that frequency differences above a threshold cannot affect the test information. Testing on the basis of such a detection result is based on the realization that most significant faults in clock circuits typically concern logic faults in the clock divider circuits, which give rise to clock frequencies that are way off from the nominal clock frequency. This type of fault shows up in significant aberrations of the resulting clock frequencies, which can be detected without requiring a clock count value to be read out from the integrated circuit. A circuit that makes an irreversible transition under control of the internal clock signal makes it possible to perform a robust test for such aberrations with a minimum of overhead.

In a further embodiment different internal clock circuits have outputs multiplexed to a shared counter and state holding circuit. Because the test using the state holding circuit is not affected by frequency differences above a threshold frequency, test circuit can be shared by many clock circuits to produce test results while requiring only little circuit overhead.

Preferably a pin multiplexing circuit is provided to couple an output of the state holding circuit to an external pin of the integrated circuit during testing. In this way the state of the state holding circuit can be read out directly, i.e. without first shifting test results through a scan chain. This means that the time points at which the state of the state holding circuit can be sampled can be selected externally. By sampling at different time points an estimate of the frequency can be obtained without requiring the clock signal outside the integrated circuit.

These and other objects and advantageous aspects of the invention will be described by means of non-limitative examples using the following figures.

Figure 1A:
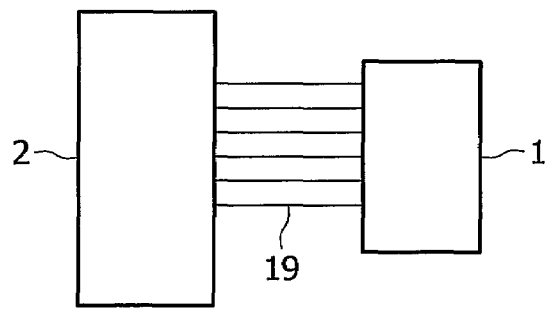
Figure 2:
Figure 2:
Figure 2:
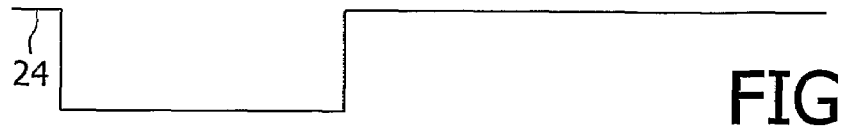
Figure 3:
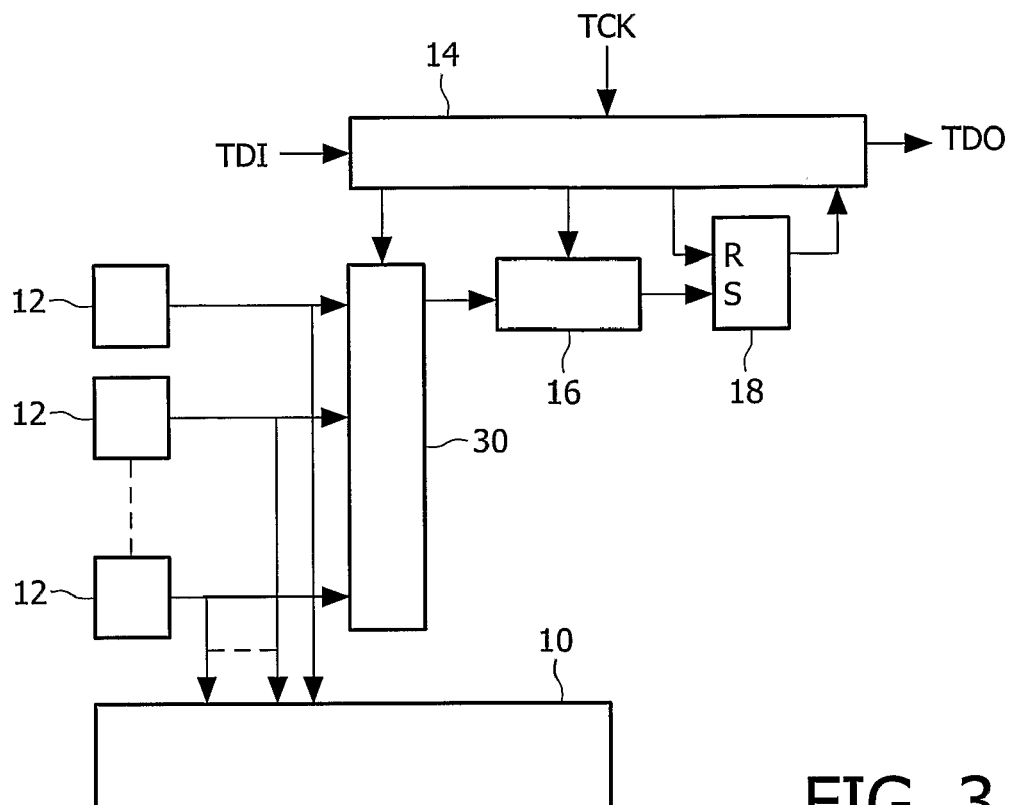
Figure 4:
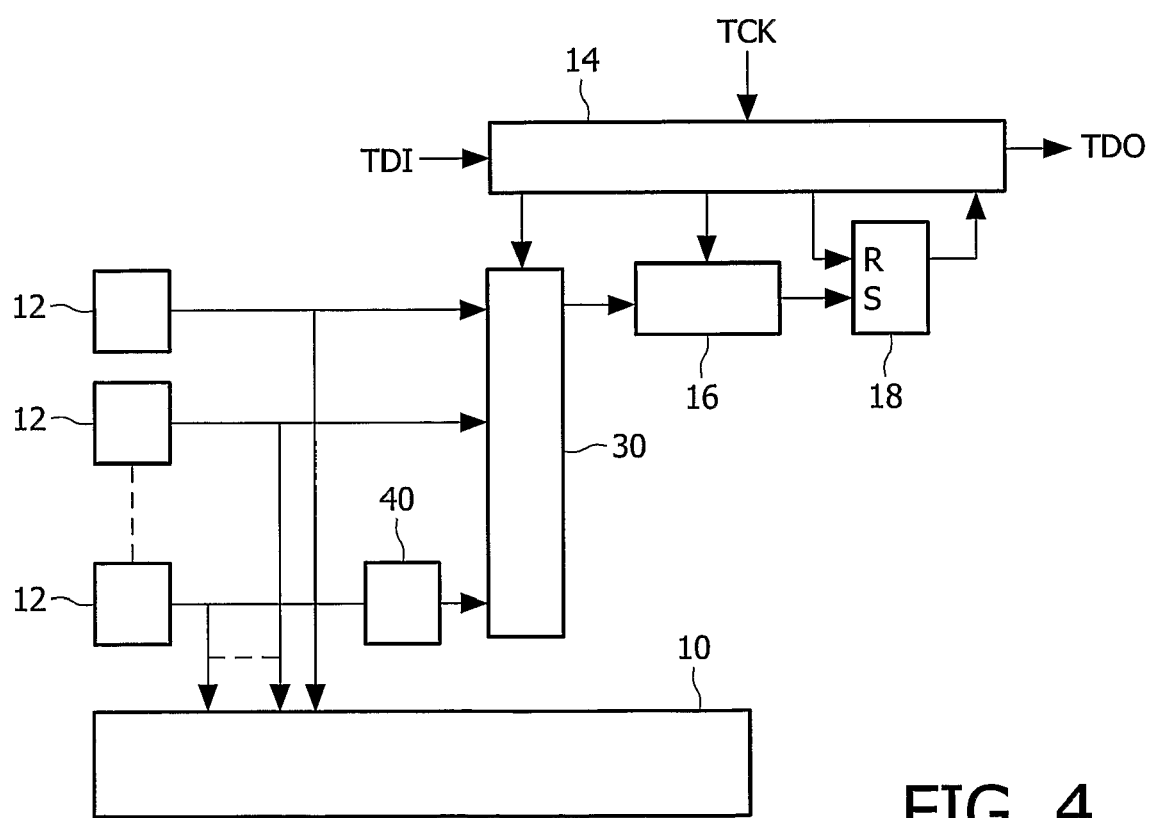

FIG. 1 shows part of an integrated circuit
FIG. 1a shows a test configuration
FIG. 2 shows timing during a test
FIG. 3-4 shows a further integrated circuits FIG. 1 shows part of an integrated circuit 1, with a functional circuit 10 and an internal clock circuit 12 coupled to a clock input of functional circuit 10. For test purposes the integrated circuit comprises a test interface circuit 14, a frequency divider 16 and a set/reset flip-flop 18. Test interface circuit 14 has a test clock input TCK, an input TDI for test data and an output TDO for test results. Furthermore test interface circuit has outputs coupled to reset inputs of frequency divider 16 and set/reset flip-flop 18. The output of internal clock circuit 12 has an output coupled to an input of frequency divider 16. Frequency divider 16 has an output coupled to a set input of set/reset flip-flop 18. Set/reset flip-flop 18 has an output coupled an input of test interface circuit 14. It should be appreciated that the figure shows only a minimum of detail. In practice many inputs and output terminals of the integrated circuit will be coupled to the functional circuit 10. Internal clock circuit 12 may be coupled to a clock reference terminal. Test interface circuit may preferably contains a pin multiplexer with an input coupled to the output of set/reset flip-flop 18 and an output coupled to an external terminal 19 of the integrated circuit that is different from the test data output TDO. Such a pin multiplexer typically has one or more further inputs, coupled for example to another circuit (not shown) that produces results during normal operation, and/or to other circuits that produce test results. Alternatively, the external terminal of pin multiplexer may be used as input of the integrated circuit during normal operation. Alternatively, test interface circuit 14 may be arranged to coupled the output of set/reset flip-flop 18 to the test data output TDO via a scan chain.

Furthermore, part of functional circuit 10 will typically be coupled to test interface circuit for receiving test data from the test data input TDI and/or to supply test results to the test data output (conversely test interface circuit 14 may receive and supply test data at the inputs and outputs terminals for functional circuit). Also a clock switching circuit may be provided to replace the clock signal at the input of functional circuit 10 by a test clock circuit during testing.

Divider circuit 16 may be implemented in any suitable way, such as for example as a cascade of divide-by-two circuits or more generally as a counter circuit such as a combination of a register and an adder wherein the adder forms a sum of a number from the register and a predetermined number (one for example) that is stored in the register each time when a clock pulse is received.

Clock circuit 12 typically contains a further divider circuit (not shown) or other logic circuitry, for example for dividing down the clock signal and/or for adjusting a phase of the clock signal so that the divided-down clock signal is phase locked to a reference signal. As another example, further divider circuit may divide down a clock source signal to generate the clock signal. Although only one internal clock circuit 12 is shown, many more may be present.

In normal operation, internal clock circuit 12 supplies a clock signal to at least part of functional circuit. As shown in FIG. 1a the integrated circuit 1, or an electronic circuit that contains the integrated circuit will be coupled for test purposes to a test apparatus 2 that is constructed to apply control signals for test interface circuit 14 and test data to the integrated circuit, as well as for receiving test results. For example, a scan test interface may be used for this purpose. When a test is performed, the test apparatus 2 applies control signals to test interface circuit 14 to cause test interface circuit 14 to switch the integrated circuit 1 to a test mode.

FIG. 2 illustrates signals used during operation in the test mode. A first signal shows the clock signal 20 from internal clock circuit 12. A second signal 22 shows a test clock signal and a third signal shows an output signal of set/reset flip-flop 18 (the relative frequencies of the signals are shown symbolically: in practice the clock frequency will typically be much higher).

During test operation test interface circuit 14 resets set/reset flip-flop 18 and divider circuit 16 at the start of a time interval defined by the test clock signal 22 (when a counter circuit is used t implement the divider, "resetting" typically involves setting the count to an initial value). At the end of the time interval (marked by a rising edge 26 of test clock 22 in the example) test interface circuit 14 copies an output signal from set/reset flip-flop 18.

During the time interval divider circuit 16 effectively counts the number of clock pulses in clock signal 20 and sets set/reset flip-flop 18 when a threshold number of clock pulses has occurred in the time interval. As a result, test interface circuit 14 will receive a first logic value from set/reset flip-flop 18 if the frequency of the clock signal is above a threshold and a second logic value if the frequency of the clock signal is below the threshold.

Test data interface 14 feeds information about the logic value to the test apparatus via an external terminal 19 of the integrated circuit. The test apparatus uses this information to decide whether the integrated circuit should be rejected or not. A control signal in test interface 14 typically selects the input of a pin multiplexer from which data will be supplied to the external terminal 19. When the logic value is required a control signal is supplied to test interface to select the output of set/reset flip-flop 18. When only the output of set/reset flip-flop 18 needs to be connected to the external terminal, pin multiplexer may be omitted.

Alternatively, the output of set/reset flip-flop 18 may be coupled to test interface circuit 14, for feeding the logic value to the test data output TDO. As a further alternative, the logic value may be combined with other test results internally in test interface 14 to compile a combined test result. The logic value, or the combined test result may be shifted out of test interface 14 through a serial scan chain shift register for example. In this case the logic value or the combined test result may be shifted out together with test results that have been captured from functional circuit 10 for example. In this way a conventional scan test apparatus can be used to test the integrated circuit including the clock circuit in a simple way, without requiring special test equipment.

The use of a pin multiplexer to feed the output signal of set/reset flip-flop 18 to an external pin has the advantage that the timing of transitions at the output of set/reset flip-flop 18 can be observed from outside integrated circuit 1, independent of the timing of capture into the scan chain. In an embodiment tester 2 samples the output signal at the external pin at respective different delays with respect to the start of counting. In this way, the tester 2 is able to obtain a more accurate estimate of the frequency of the clock signal from the delay that is needed before the sample indicates that set/reset flip-flop 18 has been set.

It should be noted that, although it is preferred that divider circuit 16 is reset to an accurately defined state (i.e. so that its divided output signal starts at a predetermined phase in a period of the divided signal (e.g. at the start of the period)), a reset to a less accurately defined state may suffice for the purpose of the invention. For example, if the divider comprises a number of divide-by-two circuits in cascade, only a number of these circuits at the low-frequency end of the cascade need to be reset. If a number of divide by two circuits at the high frequency end are not reset, this does not significantly affect the test. FIG. 3 shows an integrated circuit that comprises a plurality of internal clock circuits 12 that share divider circuit 16 and set/reset flip-flop 18. A multiplexer 30 is provided, which has inputs coupled to the clock outputs of the internal clock circuits 12 and an output coupled to an input of divider circuit 16. Test interface circuit 14 has an output coupled to a control input of multiplexer 30. By way of example, an implementation has been shown wherein the output of set/reset flip-flop 18 is coupled to test interface 14 for supplying the logic value to the test data output TDO. However, it should be appreciated that preferably the alternative of FIG. 1 is used, wherein the logic value is supplied to an external terminal of the integrated circuit via a pin multiplexer.

In operation test interface circuit 14 selects when which of the clock circuits 12 will be tested, by applying control signals to multiplexer 30. Each time when a clock circuit 12 is tested its output is coupled to the input of divider circuit 16 during a time interval, set/reset flip-flop 18 and divider circuit 16 are reset at the start of the time interval and test interface circuit 14 loads information about the state of set/reset flip-flop at the end of the time interval. Test interface circuit 14 is controlled to select clock circuits for example using external commands, or under control of an internal program that selects successive clock circuits.

The circuit of FIG. 3 is able to handle testing of clock signals of diverse frequencies. However, if a large discrepancy exists between the frequencies of the different clock signals one or more pre-dividers may be added in front of the inputs of multiplexer 30, so that the signals that are applied to the multiplexer have comparable frequencies, even if the clock signals that are applied to functional circuit 10 have widely different frequencies.

FIG. 4 shows an example of a circuit wherein a pre-divider circuit 40 has been added between the output of a clock circuit 12 and an input of multiplexer circuit 30.

It should be understood that the invention is not limited to the circuits that have been shown. For example, as an alternative to the use of a set/reset flip-flop 18, divider 16 may have a disable input coupled to its output. In this embodiment the further operation of divider 16 is disabled once divider 16 has reached the threshold value and the operation is resumed when divider 16 is reset by test interface circuit 14. Disabling may also be implemented by adding a gate circuit (not shown) between clock circuit 12 and divider 16, the gate circuit having a disable input coupled to the output of divider circuit 16, so that further clock pulses from clock circuit 12 are blocked once the threshold number of pulses have been received. In a further embodiment, divider 16 is coupled to clock circuit 12 to stop the entire clock circuit 12 once the threshold number of pulses has been received.

Preferably, a predetermined threshold is used, but in another embodiment test interface circuit 14 is coupled to divider circuit 16 to select the threshold from a plurality of programmable thresholds. A programmable pre-scaler may be provided between clock circuit 12 and divider 16 for this purpose.

During testing various tests may be performed. In a first type of test it is tested whether the frequency of a clock signal is above a threshold. For this type of test, the time interval between the start of frequency division and sampling of set/reset flip-flop should be at least so long that clock circuit 12 will produce the threshold number of pulse when it operates normally. An error will be detected if there are faults in the logic circuitry of the clock circuit 12 that lead to a significantly lower frequency.

In a second type of test it is tested whether the frequency of a clock signal does not exceed a threshold. For this type of test, the time interval between the start of frequency division and sampling of set/reset flip-flop should be at most so long that clock circuit 12 will not produce the threshold number of pulse when it operates normally. An error will be detected if there are faults in the logic circuitry of the clock circuit 12 that lead to a significantly higher frequency.

The same circuit may be used to perform both the first and second type of test. This can be realized for example by using a programmable pre-scaler in front of divider circuit 16, which is controlled by test interface circuit 14. In this embodiment, test interface circuit sets the prescaler to divide by a higher division ratio when the first type of test is performed than the division ratio when the second type of test is performed. Alternatively, different tests may be realized by performing respective tests wherein different durations are used for the time interval between the start of frequency division and sampling of set/reset flip-flop 18.

It is event possible to perform accurate frequency measurements with the circuit of FIG. 1, when the test is repeated with a series of different test clock frequencies, so that the duration of the time interval between reset of divider 16 and sampling of set/reset flip-flop 18 assumes a series of different values. However, if an accurate measurement is routinely required, a clock counter circuit whose count output can be sample by test interface circuit 14 is preferred. Because of the requirement to perform a plurality of measurements the circuit of FIG. 1 should be used to perform such accurate measurements only exceptionally if at all.

The invention claimed is:

1. A testable integrated circuit, comprising
    a test interface circuit arranged to switch the integrated circuit between a functional operating mode and a test mode
    an internal clock circuit with a clock output for clocking functional circuits of the integrated circuit at least in the functional operating mode;
    a test circuit comprising
    a pulse counting circuit with a clock input coupled to the clock output;
    a state holding circuit that is coupled to the pulse counting circuit or is part of the pulse counting circuit, arranged so that the state holding circuit will lock into a predetermined state when a threshold number of clock pulses has bean applied to the clock input following a start of a time interval defined by the test interface circuit;
    the test interface circuit being coupled to the state holding circuit for reading out information from the integrated circuit about whether the state holding circuit has reached the predetermined state before the end of the time interval.

2. A testable integrated circuit according to claim 1, wherein the clock circuit is one of a plurality of clock circuits, each of the clock circuits having a respective clock output for clocking the functional circuits, the integrated circuit comprising a multiplexing circuit coupled between the clock outputs of the clock circuits and the clock input of the pulse counting circuit, the multiplexing circuit (30) having a control input coupled to the test interface circuit, for controlling which of the clock circuits the multiplexing circuit will couple to the clock input of the pulse counting circuit, under control of a test command.

3. A testable integrated circuit according to claim 1, wherein the test interface circuit comprises a pin multiplexing circuit with an input coupled to an output of the state holding circuit and an output coupled to an external terminal of the integrated circuit.

4. A method of testing an integrated circuit that comprises an internal clock circuit with a clock output for clocking functional circuits of the integrated circuit at least in a functional operating mode, the method comprising
    switching the integrated circuit to a test mode and signalling a start of a test time interval;
    counting clock pulses from the internal clock circuit 12 from the start of the test time interval;
    locking a state holding circuit into a predetermined state if the internal clock circuit has produced more than a predetermined number of clock pulses from the start of the test time interval;
    reading information about whether the state holding circuit has reached the predetermined state in the test time interval;
    supplying said information to a test evaluation apparatus to accept or reject the integrated circuit dependent on said information.

5. A method according to claim 4, wherein the integrated circuit comprises a plurality of internal clock circuits, each with a respective clock output for clocking the functional circuits, the method comprising coupling clock signals from respective ones of the clock outputs successively to the state holding circuit, through a counting circuit, each for locking the state holding circuit into the predetermined state if the respective one of the clock output has produced more than a predetermined number of clock pulses from the start of a respective test time interval.

\* \* \* \* \*